United States Patent [19]

Hoshi et al.

[11] 4,219,754
[45] Aug. 26, 1980

[54] TEMPERATURE COMPENSATION BY POSITIONING OF PLURAL PIEZOELECTRIC VIBRATORS IN AN ELECTRONIC WRISTWATCH

[75] Inventors: Hideo Hoshi; Shiro Mitsugi, both of Tokyo, Japan

[73] Assignee: Kabushiki Kaisha Daini Seikosha, Tokyo, Japan

[21] Appl. No.: 932,958

[22] Filed: Aug. 11, 1978

[30] Foreign Application Priority Data

Aug. 23, 1977 [JP] Japan ............................ 52/100796

[51] Int. Cl.² .................. G04C 3/00; H03B 5/32; H01L 41/04
[52] U.S. Cl. .................................. 310/315; 310/342; 310/348; 331/162; 368/159
[58] Field of Search ............. 58/23 R, 23 AC, 23 V, 58/23 TF; 310/315, 342, 348; 331/116 R, 162

[56] References Cited

U.S. PATENT DOCUMENTS 3,978,650  9/1976  Hashimoto et al. ............. 58/23 AC Primary Examiner—Edith S. Jackmon
Attorney, Agent, or Firm—Robert E. Burns; Emmanuel J. Lobato; Bruce L. Adams

[57] ABSTRACT

In an electronic wristwatch having a watch body an a plurality of electronic vibrators having frequency-position characteristics, the frequency-temperature characteristic of the standard signal generated thereby is improved by positioning the vibrators in the watch body so that at least one vibrator has a different frequency-position characteristic than the other vibrators to compensate for any frequency deviation thereof due to the orientation of the watch body.

9 Claims, 13 Drawing Figures

TEMPERATURE COMPENSATION BY POSITIONING OF PLURAL PIEZOELECTRIC VIBRATORS IN AN ELECTRONIC WRISTWATCH

BACKGROUND OF THE INVENTION

The present invention relates to an improvement in the frequency-position characteristic of electronic wrist watches by improving the frequency temperature characteristic of the time standard signal using a plurality of piezoelectric vibrators, for instance, two piezoelectric vibrators.

Conventionally, a method for connecting two piezoelectric vibrators in parallel is shown in FIG. 1 to obtain a frequency-temperature characteristic as shown in FIG. 2 has already been proposed. However, in a portable instrument such as an electronic wrist watch, the main problem to be solved is to decrease the frequency-position characteristic in order to use a vibrator of this type for the standard signal of the portable instrument, since the frequency-position characteristic is an important element in a portable instrument such as the electronic wrist watch. Particularly, in order to make a highly precise electronic wrist watch, the frequency-position and frequency-temperature characteristics should be held down to within several tenths P.P.M., and thus a method to hold the frequency-position characteristic within the above value is strongly desired.

SUMMARY OF THE INVENTION

Therefore, the object of the present invention is to improve the frequency-position characteristic of two piezoelectric vibrators connected in parallel to thereby improve the frequency-position characteristic of the standard signal by suitably arranging the position of mounting the vibrator in accordance with the frequency-position characteristic of each of the vibrators.

Hereafter, the present invention will be described in detail in conjunction with the drawings.

DETAILED DESCRIPTION OF THE INVENTION

Figure 1:
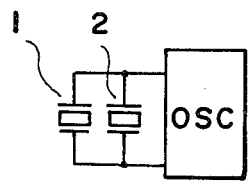
FIG. 1 shows two piezoelectric vibrators fitted up with an oscillating circuit.
Figure 2:
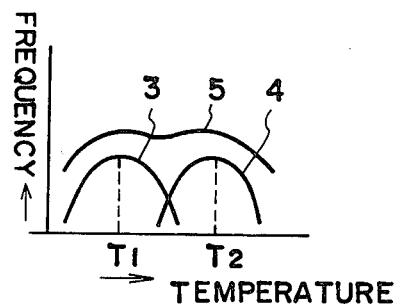
FIG. 2 is a diagram showing single and composite frequency-temperature characteristics of the circuit of FIG. 1.
Figure 3:
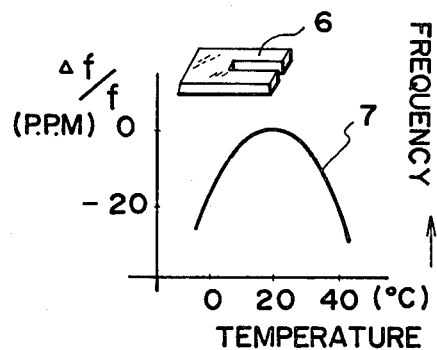
FIG. 3 is a diagram showing a frequency-temperature characteristic of a tuning fork type quartz crystal vibrator.
Figure 4:
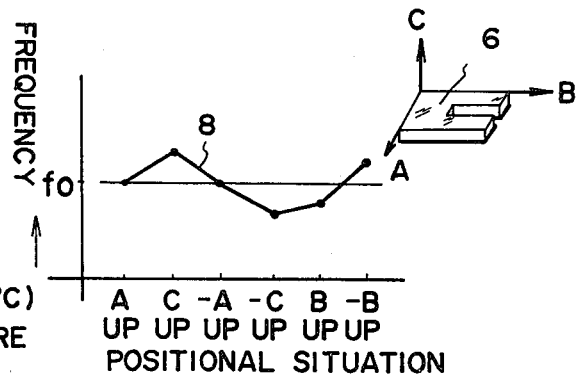
FIG. 4 is a diagram showing a frequency-position characteristic of a thin tuning fork type quartz crystal vibrator.

FIG. 3 shows a frequency-temperature characteristic 7 of a thin tuning fork type quartz crystal vibrator 6 having a thickness of less than 0.5 mm and FIG. 4 shows the frequency-position characteristic thereof. It is to be noted that if two quartz crystal vibrators of this type are electrically connected in parallel, the frequency-temperature characteristic 5, as shown in FIG. 2, is obtained provided that the peak temperature points T1 and T2 of the two are different.

Figure 5:
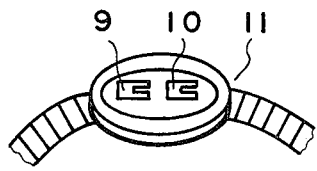
FIG. 5 is a sketch of a wristwatch fitted up with two vibrators.
Figure 6:
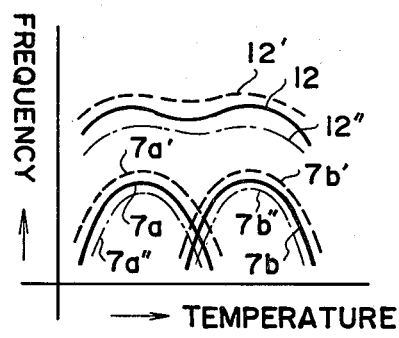
FIG. 6 is a diagram showing frequency-temperature characteristics and frequency-position characteristics.
Figure 7:
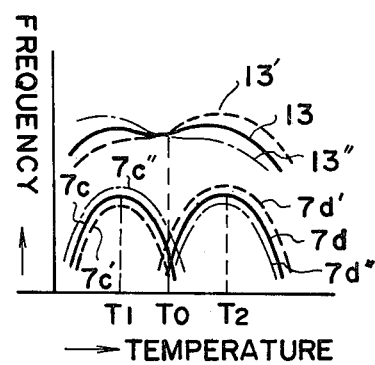
FIG. 7 is a diagram showing frequency-temperature characteristics and frequency-position characteristics according to the present invention.
Figure 8:
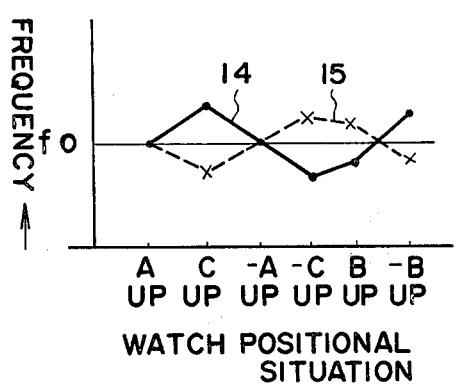
FIG. 8 is a diagram showing frequency-position characteristics in the case where the directions of the vibrators are opposite each other.

The frequency-temperature characteristic of the vibrators 9 and 10 which are fitted up in a wrist watch 11, as shown in FIG. 5, is considered for the different arrangements for which they can be mounted;

In the first place, when the vibrators 9 and 10 are held in the same positions of both length (B) and thickness (C) directions, and also have the same frequency-position characteristics therefor, the improved frequency-temperature characteristic 12 shown in FIG. 6 will vary 12' to 12" by the positional variations of wrist watch. In the next place, when the parallel connected vibrators 9 and 10 are oppositely arranged only in the thickness direction thereof, namely, one of which is arranged on the C-axis and the other of which is arranged on the −C-axis, and when the frequencies of the two vibrators are the same, namely, the two vibrators have the frequency-temperature characteristics 7c and 7d shown in FIG. 7 the frequency-temperature characteristic 13 is obtained. The frequency-temperature characteristic 13 varies to 13' when the wrist watch is set so that one of the vibrators is positioned on the C-axis and to 13" when the wrist watch is set so that the other vibrator is positioned on the −C-axis since the deviation of positions of the vibrators on the C-axis and −C-axis are in opposite directions against the center value fo, and the frequency temperature characteristics vary as 7c', 7d', 7c" and 7d". The frequencies of two vibrators are easily made the same by changing the width direction (A) thereof to the vertical direction, since the frequencies of the vibrators on the A-axis and −A-axis are the same as shown in FIG. 4. And as shown in the curve lines 13, 13' and 13" in FIG. 7, the distance from the central temperature T0 of the peak temperatures T1 and T2 of each of the vibrators is not influenced by the frequency-position characteristic of each of the vibrators. Thereupon, if T0 is set in the vicinity of the normal temperature, the frequency-temperature characteristic is improved and also the frequency-position characteristic is drastically improved in comparison with a single vibrator. The above noted fact can be applied in the same way to the frequency-position characteristic in the length direction (B). Accordingly, as shown in FIG. 8, if the frequency-position characteristic of one of the vibrators is a curve line 14, the other is arranged so that the frequency-position characteristic is curve line 15. In this way, by the above arrangement of the vibrators, the deviation of the frequency-temperature characteristics thereof at the central temperature T0 can almost be diminished to zero. Also, the frequency-position characteristic can be improved by improving either the thickness direction (C) or the length direction (B). Accordingly, it is to be understood that the above is not limited to the thin tuning fork type vibrator, but that the frequency-position characteristic of vibrators of other shape and vibration modes can be improved if the frequency-position characteristic of each of the vibrators is previously known.

Figure 9:
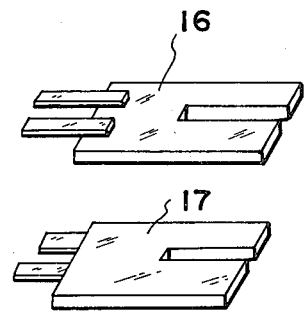
FIGS. 9, 10 and 11 show embodiments of the present invention of the relative positions of the vibrators.
Figure 10:
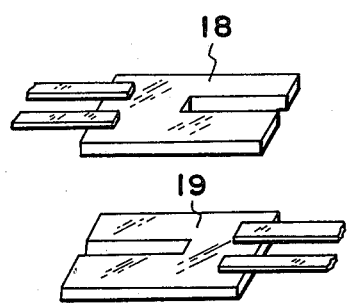
Figure 11:
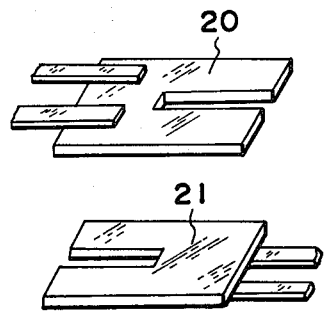

FIGS. 9 to 11 show embodiments of the present invention using the tuning fork type vibrator.

Figure 12:
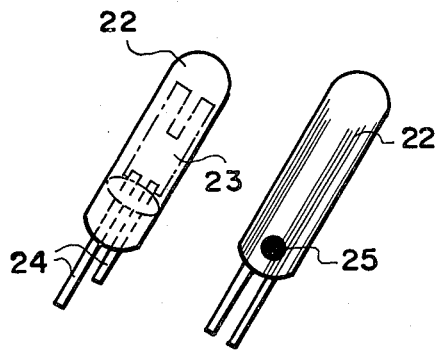
FIGS. 12 and 13 show embodiments of the present invention including vibrators mounted in capsules.
Figure 13:
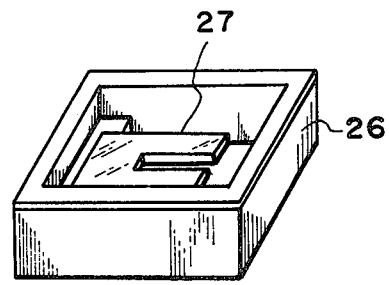

Here, vibrators 16 and 21 have the same frequency-temperature characteristics. FIG. 9 shows an embodiment when the vibrators 16 and 17 are oppositely mounted in the thickness (C) direction. FIG. 10 shows an embodiment where the vibrators 18 and 19 are oppositely arranged in the length direction (B). FIG. 11 shows an embodiment where the vibrators 20 and 21 are oppositely arranged in both the thickness (C) and the length (B) directions. If the vibrators 18 and 19 are fabricated to have the position-characteristics of those in the opposite direction in the thickness direction, it will be easily understood that the vibrators are opposite both in the thickness and length directions by arranging the vibrators as shown in FIG. 10. FIG. 12 shows an embodiment where a vibrator 23 is enclosed in a metal capsule 22 or the like, the position of the vibrator being quite indistinguishable from the outside. Therefore, the length of lead wires 24 of each capsule are fabricated differently or a mark 25 is marked on said capsule in order to distinguish the position of the vibrator. And as shown in FIG. 13, the position of a vibrator 27 is distinguished by a marking directly on the vibrator 27, in the case where capsule 26 has a partially transparent portion. In this case, one can also place a mark directly on the capsule itself even when it has a partially transparent portion.

As described above, by adopting the equipment and arrangement of this invention, the frequency-temperature characteritic is improved and simultaneously the frequency-position characteristic thereof is also drastically improved by using two piezoelectric vibrators. And as seen in FIG. 7, though the frequency-temperature characteristic is somewhat incorrect, if the central temperature T0 is selected to be a suitable average regarding the employing temperature of such an instrument, it offers no problem. Particularly, in order to make the electronic wrist watch highly accurate, it is extremely important to diminish the deviation of the frequency-position characteristic thereof since the discrepancy of frequencies during carrying directly effects the precision thereof. And although two vibrators must have the same frequency-position characteristics, it is not an obstacle to this invention since the frequency-position characteristics can be changed freely by changing the dimensions, shapes, supporting methods and the like of the vibrators.

We claim:

1. In an electronic wristwatch having a watch body and a plurality of piezoelectric vibrators having frequency-position characteristics for improving the frequency-temperature characteristic of the standard signal generated thereby, the improvement comprising positioning the vibrators in the watch body so that at least one vibrator has a different frequency-position characteristic than the other vibrators to compensate for any frequency deviation thereof due to the orientation of the watch body.

2. An electronic wristwatch as claimed in claim 1, comprising two piezoelectric vibrators differently positioned in the watch body and having different frequency-position characteristics as a result thereof.

3. An electronic wristwatch as claimed in claim 1 or claim 2, wherein the frequency-position characteristic of each of the vibrators have equal absolute values for every possible position and wherein the vibrators are positioned in the watch body so that the position for the equal absolute values are approximately opposite each other.

4. An electronic wristwatch as claimed in claim 1, wherein at least two piezoelectric vibrators are electrically connected in parallel.

5. An electronic wristwatch as claimed in claim 1, wherein at least two piezoelectric vibrators comprise a tuning fork type quartz crystal vibrator having a thickness of less than 0.5 mm.

6. An electronic wristwatch as claimed in claim 1, further comprising vibrator capsules each enclosing at least two piezoelectric vibrators, wherein said at least two vibrators are oppositely oriented in the capsules to render the frequency-position characteristics thereof opposite and each of the capsules is positioned in the watch body in the same orientation.

7. An electronic wristwatch as claimed in claim 1, further comprising vibrator capsules enclosing at least two piezoelectric vibrators, wherein said at least two vibrators are oriented in the capsules to render the frequency-position characteristics thereof the same and the capsules are oppositely oriented within the watch body.

8. An electronic wristwatch as claimed in claim 1 further comprising a vibrator capsule enclosing at least two piezoelectric vibrators, wherein said at least two piezoelectric vibrators are oppositely oriented in the capsule so that the frequency-position characteristics thereof are opposite each other.

9. In an electronic wristwatch having a watch body, two piezoelectric vibrators having frequency-position characteristics for improving the frequency-temperature characteristics of standard signal, and two vibrator capsules each enclosing one of the vibrators and mounted in the watch case, the improvement comprising positioning each of said vibrators in the associated capsule in a different orientation so that the frequency-position characteristic thereof is different from the other when the capsules are in a given position in the watch case, and wherein the vibrator capsules are marked to clearly indicate the differences of said frequency-position characteristics thereof.

* * * * *